(12) United States Patent
Hersee

(10) Patent No.: US 8,866,125 B2
(45) Date of Patent: Oct. 21, 2014

(54) INTEGRATION OF LED DRIVER CIRCUIT WITH LED

(71) Applicant: Stephen D. Hersee, Cudjoe, FL (US)

(72) Inventor: Stephen D. Hersee, Cudjoe, FL (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 13/875,264

(22) Filed: May 1, 2013

(65) Prior Publication Data

US 2013/0240832 A1  Sep. 19, 2013

Related U.S. Application Data

(62) Division of application No. 13/078,368, filed on Apr. 1, 2011, now Pat. No. 8,455,856.

(60) Provisional application No. 61/322,416, filed on Apr. 9, 2010.

(51) Int. Cl.
*H01L 29/06* (2006.01)
*H01L 29/778* (2006.01)
*H01L 25/16* (2006.01)
*H01L 27/15* (2006.01)
*H01L 33/00* (2010.01)
*H01L 33/06* (2010.01)
*H01L 29/20* (2006.01)

(52) U.S. Cl.
CPC ............ *H01L 27/15* (2013.01); *H01L 29/7787* (2013.01); *H01L 25/167* (2013.01); *H01L 33/0041* (2013.01); *H01L 33/06* (2013.01); *H01L 29/2003* (2013.01)
USPC ............ 257/13; 257/12; 257/14; 257/E27.12; 257/E33.008; 257/107; 257/115; 257/E31.071; 257/E27.052; 257/E27.079; 257/E29.036; 257/E29.037; 257/E29.038; 257/E29.046; 257/E29.047; 257/E29.115; 257/E29.125; 257/E29.196

(58) Field of Classification Search
USPC .......... 257/13, 12, 14, E27.12, E33.008, 107, 257/115, E31.071, E27.052, E27.079, 257/E29.036, E29.037, E29.038, E29.046, 257/E29.047, E29.115, E29.125, E29.196
See application file for complete search history.

(56) References Cited

U.S. PATENT DOCUMENTS

2008/0014662 A1* 1/2008 Yabuki ........................... 438/23
2009/0072267 A1   3/2009 Goshonoo et al.

* cited by examiner

*Primary Examiner* — Timor Karimy
(74) *Attorney, Agent, or Firm* — MH2 Technology Law Group, LLP

(57) ABSTRACT

Various embodiments provide materials and methods for integrating exemplary heterostructure field-effect transistor (HFET) driver circuit or thyristor driver circuit with LED structures to reduce or eliminate resistance and/or inductance associated with their conventional connections.

6 Claims, 4 Drawing Sheets

INTEGRATION OF LED DRIVER CIRCUIT WITH LED

RELATED APPLICATIONS

This application is a divisional of U.S. patent application Ser. No. 13/078,368, filed Apr. 1, 2011, which claims priority to U.S. Provisional Patent Application No. 61/322,416, filed Apr. 9, 2010, which is hereby incorporated by reference in its entirety.

GOVERNMENT RIGHTS

This disclosure was made with Government support under Contract No. EEC-0812056 awarded by the National Science Foundation. The U.S. Government has certain rights in the invention.

BACKGROUND

The emerging market of solid state lighting (SSL) has created a need for high-power, efficient LEDs (i.e., light emitting diodes) that can emit visible light. GaN-based LEDs are widely used for SSL applications. To compete with conventional lighting devices, the GaN-based LEDs must operate at high current, which places increased demands on the driver circuit for LEDs.

A conventional LED driver circuit is often separated or placed remote from the LED device. This, however, causes problems. One problem includes a voltage drop generated by a resistance in the wiring between the LED and its driver circuit. This power is essentially wasted. The overall energy efficiency of the LED lamp fixture is then unnecessarily reduced.

Another problem is damage of the LED and/or its driver circuit caused by inductance in the wiring between the LED and its driver circuit when high current is being used. It is well known that changing the current in an inductor with respect to time will generate a voltage across the inductor. For example, if an attempt is made to quickly start or stop a large current flowing through an inductance, a large voltage will build up across the inductance. This large voltage may momentarily cause large current to flow through the LED and the driver circuit, and may damage either or both.

Thus, there is a need to overcome this and other problems of the prior art and to provide integrated LED devices to reduce or eliminate resistance and inductance associated with conventional connection between the LED and its driver circuit.

SUMMARY

According to various embodiments, the present teachings include an integrated light emitting diode (LED) device. The integrated LED device can include a heterostructure field-effect transistor (HFET) driver circuit and an LED structure. The HFET driver circuit can include an epi-layer disposed over a substrate with a first portion of the epi-layer configured to form a heterostructure. The LED structure can be disposed ever a second portion of the epi-layer and as an extended drain region of the HFET driver circuit. The LED structure can include a multi-quantum-well (MQW) active region.

According to various embodiments, the present teachings also include an integrated LED device having a thyristor driver circuit and an LED structure. The thyristor driver circuit can include a thyristor active region on a thyristor cathode and the LED structure can be disposed over a portion of the thyristor active region and as an extended anode of the thyristor driver circuit. The LED structure can be disposed over an opposing surface of the thyristor cathode and can include a MQW active region.

According to various embodiments, the present teachings also include a method for forming an integrated LED device. In this method, a thyristor driver circuit including a thyristor active region on a thyristor cathode can be formed and the thyristor driver circuit can be a silicon-based thyristor. At least one n-doped epi-layer can be formed on a surface portion of the thyristor active region opposing the thyristor cathode; and a MQW active region can be epitaxially formed over the at least one n-doped epi-layer to form an LED structure as an extended anode of the thyristor driver circuit.

According to various embodiments, the present teachings further include a method for forming an integrated LED device. In this method, a heterostructure field-effect transistor (HFET) driver circuit can be formed by first forming an epi-layer over a substrate; then forming a 2-dimensional electron gas (2DEG) layer in a surface of a first portion of the epi-layer; and then forming a cap layer over the epi-layer such that the 2DEG layer is at an interface there-between. A second portion of the epi-layer can be doped to form an n-doped epi-region, followed by epitaxially forming a multi-quantum-well region thereover to form an LED structure as an extended drain region of the HFET driver circuit.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the invention.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Various embodiments provide materials and methods for integrated LED devices having driver circuit structures integrated with LED structures. In embodiments, an exemplary integrated LED device can include a driver circuit co-located with an LED structure in which resistance and/or inductance associated with their conventional connections can be reduced or eliminated.

FIGS. 1A-1B and FIGS. 2A-2B depict exemplary integrated LED devices in accordance with various embodiments of the present teachings.

Figure 1A:
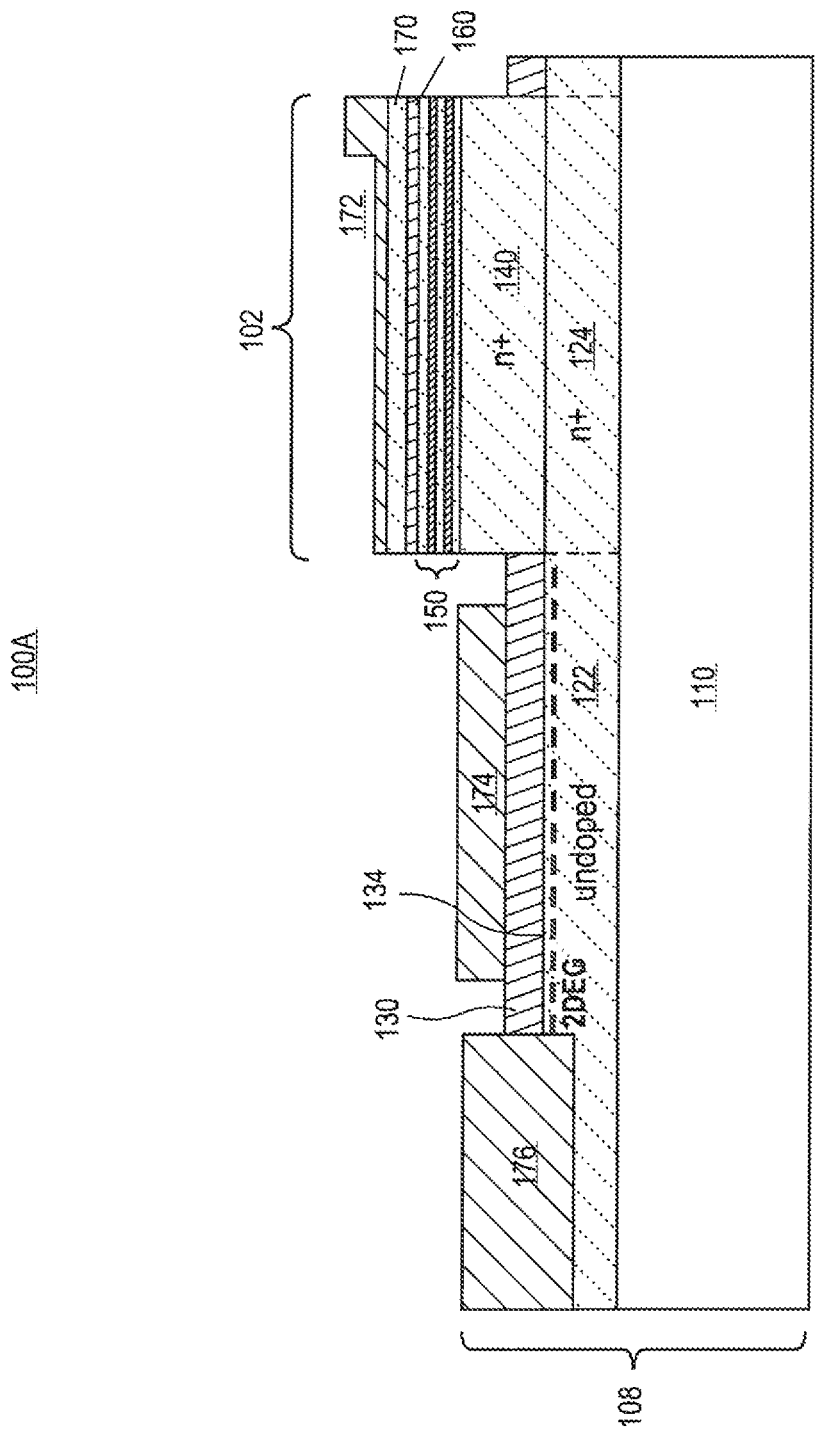
FIGS. 1A-1B depict various exemplary integrated LED devices in accordance with various embodiments of the present teachings.
Figure 1B:
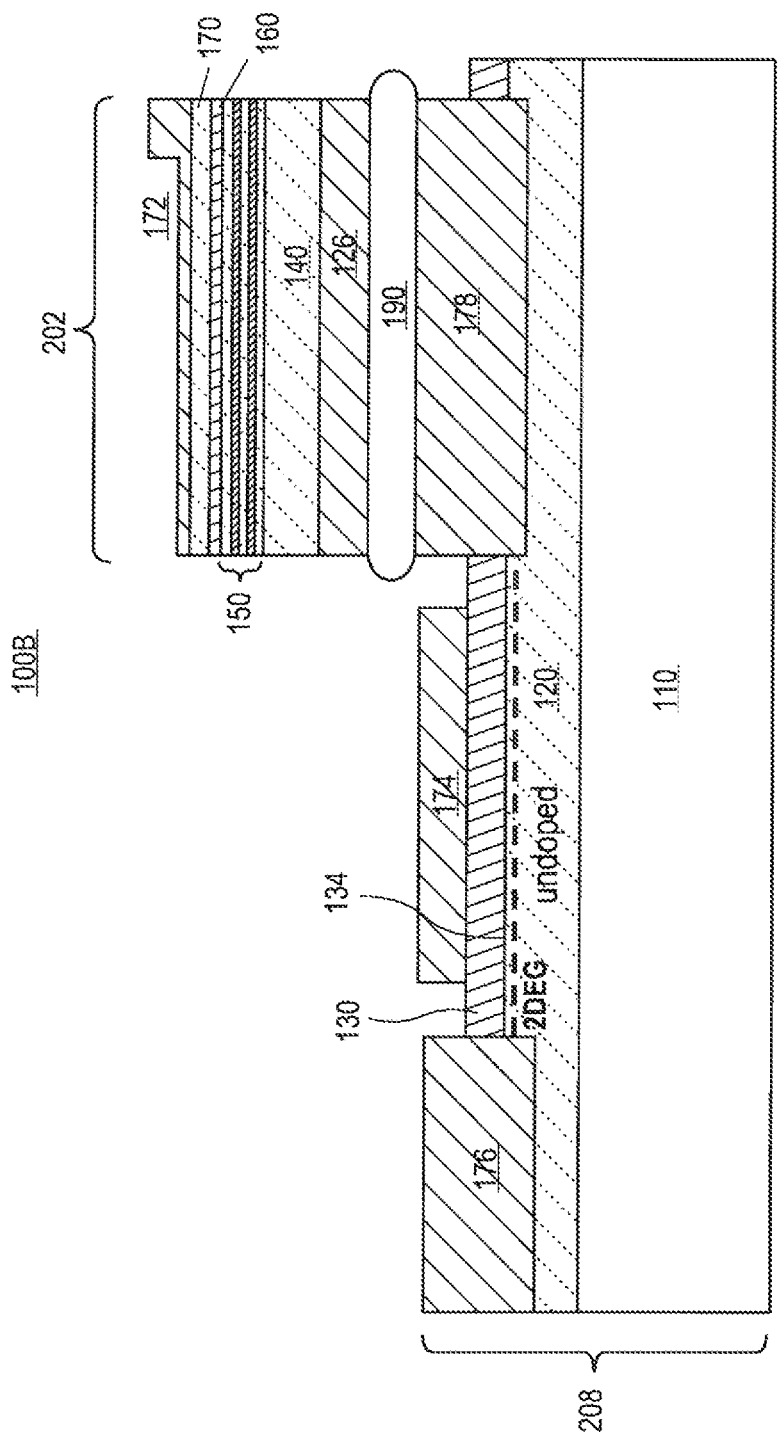
Figure 2A:
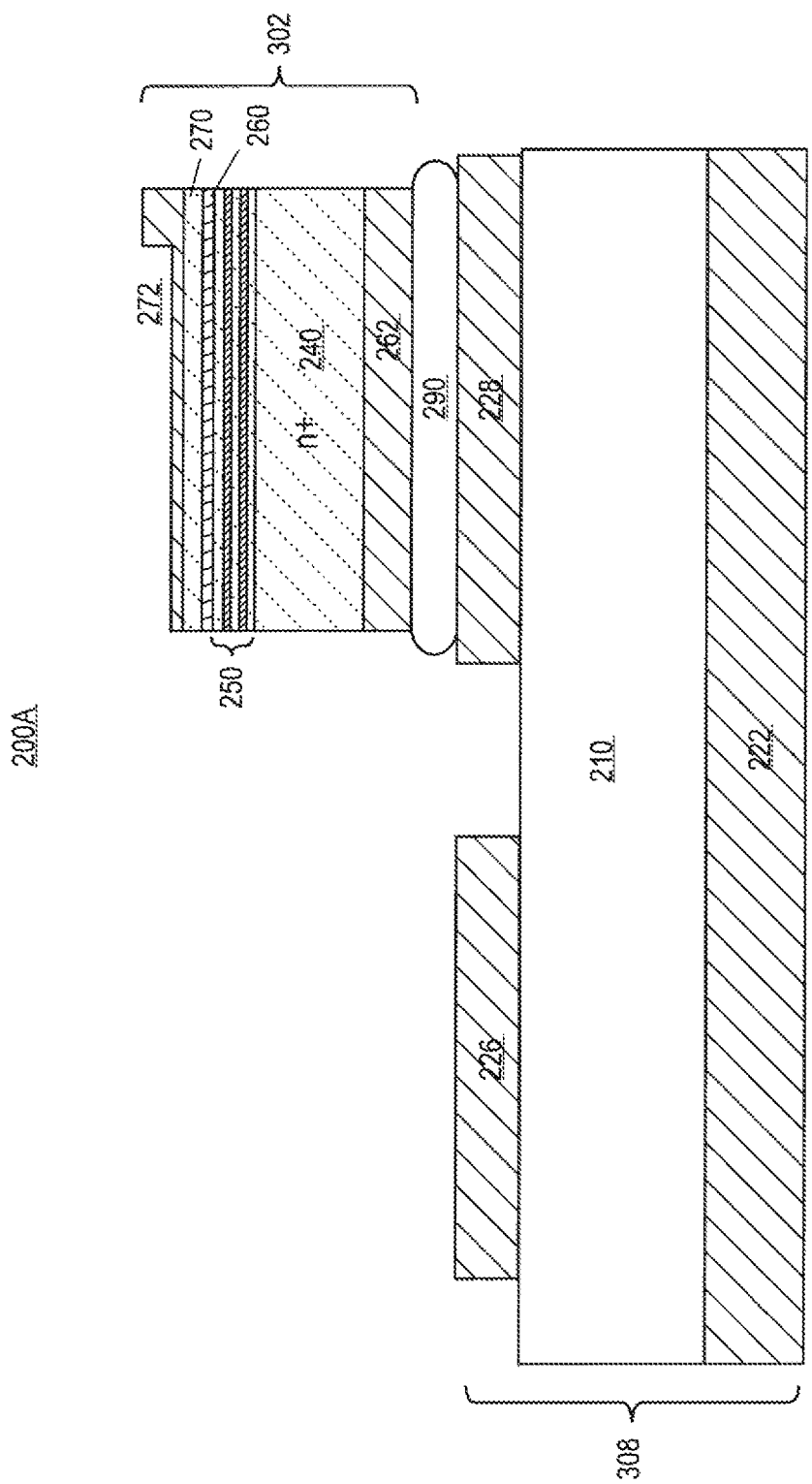
FIGS. 2A-2B depict another set of exemplary integrated LED devices in accordance with various embodiments of the present teachings.
Figure 2B:
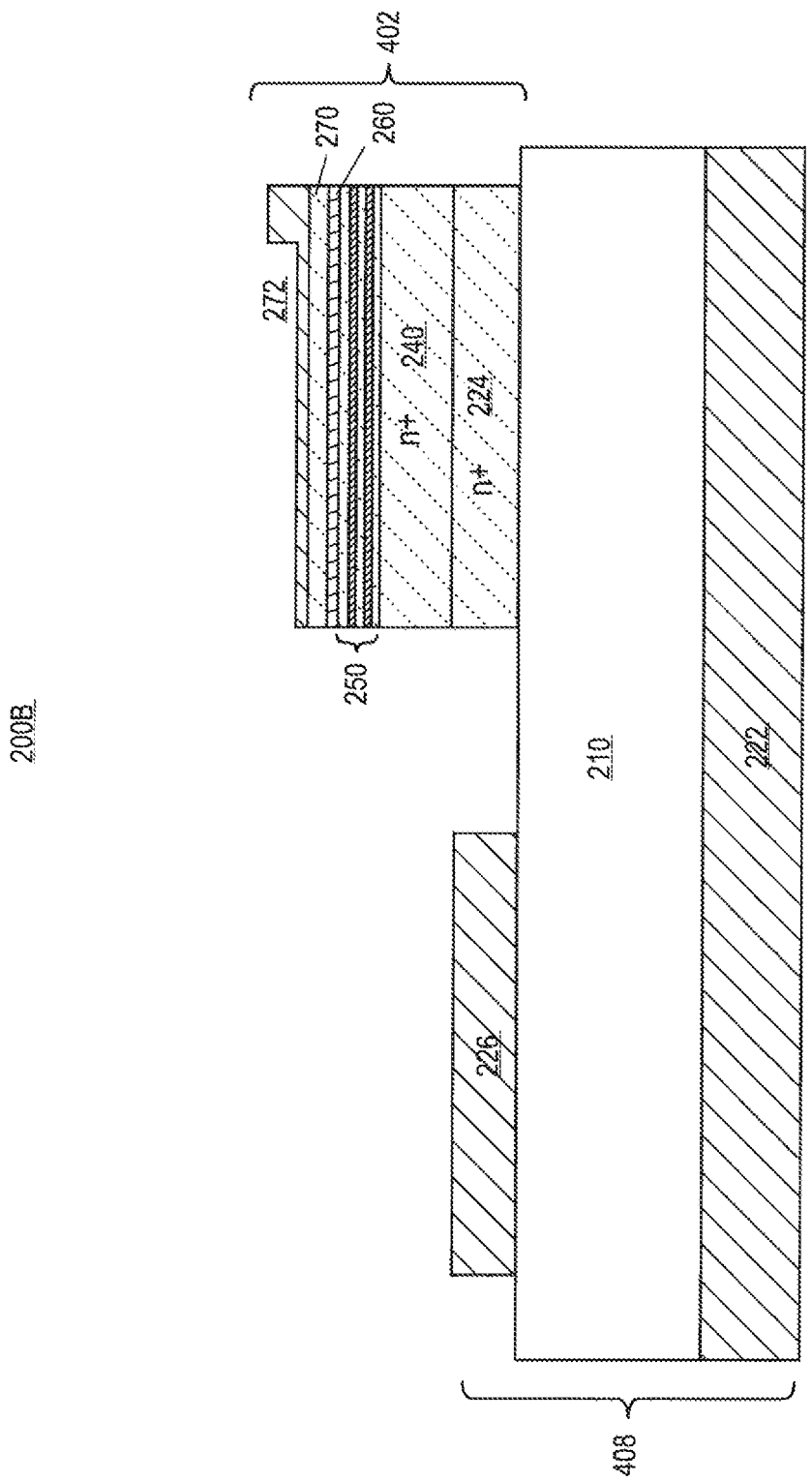

In embodiments, the exemplary devices 100A-100B in FIGS. 1A-1B and 200A-200B in FIGS. 2A-2B, each including a drive circuit co-located with an LED structure, can be formed by various crystal growth techniques including, but not limited to, metal-organic chemical vapor deposition (MOCVD) (also known as organometallic vapor phase epitaxy (OMVPE), pulsed MOCVD, molecular-beam epitaxy (MBE), gas source MBE (GSMBE), metal-organic MBE (MOMBE), atomic layer epitaxy (ALE), and/or hydride vapor phase epitaxy (HVPE). However, other standard fabrication processes including, for example, implantation, lithography, device metallization, encapsulation, and/or packaging can also be used to complete formation of the integrated LED devices.

In embodiments, the exemplary integrated devices 100A-100B and 200A-200B, each including a drive circuit co-located with an LED structure, can be formed using a Group III-V compound semiconductor materials system, such as, a Group III-N compound materials system including one or more materials of GaN, AlN, InN, InGaN, AlInGaN, AlGaN, and combinations thereof.

For example, the LED structure in the exemplary devices 100A-100B and 200A-200B can include a layered multi-quantum-well (MQW) structure having a MQW active region disposed between oppositely-doped layers. The MQW active region can include, for example, Group III-N quantum wells, such as InGaN/GaN quantum wells, AlGaN/GaN quantum wells, or other III-N quantum wells. Other exemplary materials used for the MQW active region can include one or more materials selected from AlN, InN, and/or AlInGaN.

Various dopants can be used for the exemplary devices 100A-100B and 200A-200B to provide desired conductivities. The dopant can be, for example, a p-type dopant chosen from Group II of the periodic table (e.g. Mg, Zn, Cd or Hg); a p-type dopant chosen from Group IV of the periodic table, (e.g., C); or an n-type dopant chosen from a group consisting of Si, Ge, Sn, S, Se and Te. In embodiments, the conductivity type of the semiconductor materials or the epi-layers described herein can be reversed between an n-type and a p-type in accordance with various embodiments of the present teachings.

Conductive materials and structures can be used for forming the exemplary devices 100A-100B and 200A-200B. For example, conductive materials and structures can be used as bump bonds, bump pads, electrodes, and/or electrical contacts such as a p-contact or an n-contact for the driver circuits and/or LED structures. The conductive materials and structures can include metals such as indium (In), titanium (Ti), aluminum (Al), platinum (Pt), nickel (Ni) or gold (Au), for example, in a number of multi-layered combinations such as Al/Ti/Pt/Au, Ni/Au, Ti/Al, Ti/Au, Ti/Al/Ti/Au, and/or Ti/Al/Au using techniques known to one of ordinary skill in the art.

Referring to FIG. 1A, the device 100A can include a driver circuit 108 having a substrate 110. The substrate 110 can be formed of a material including, but not limited to, sapphire, silicon carbide (SiC), silicon (Si), silicon-on-insulator (SOI), and/or GaN.

Over the substrate 110, an epitaxial layer, for example, a GaN layer, can be formed over the entire surface of the substrate 110. The epitaxial layer on the substrate 110 can be defined into various portions, for example, with a first portion being selectively doped (e.g., n-type or p-type) to have a doped epi-region 124 for forming the LED structure 102 there-over, and with a second portion remaining un-doped as an un-doped epi-region 122.

The driver circuit 108 can be an FET (i.e., field-effect transistor) driver circuit including, such as, for example, a heterostructure field-effect transistor (HFET), which is also referred to as a modulation-doped field-effect transistor (MODFET), a high electron mobility transistor (HEMT), or a two-dimensional electron gas field-effect transistor (TEG-FET).

In one embodiment, a heterostructure of an exemplary HFET driver circuit can be formed to include a portion of the un-doped epi-region 122. As shown in FIG. 1A, the exemplary HFET driver circuit can include a cap layer 130, such as a wide-bandgap cap layer, formed over the undoped epi-region 122 (e.g., an un-doped GaN region). The exemplary HFET driver circuit can also include a two-dimensional electron gas (2DEG) layer 134 formed at the interface between the cap layer 130 and the undoped epi-region 122. The cap layer 130 can provide materials and/or alloy compositions and/or doping concentrations to allow control of the carrier densities within the 2DEG layer.

In embodiments, the cap layer 130 can be an Al-containing material (e.g., art AlGaN cap layer) having an AlN molar fraction ranging from about 5% to about 40%. The cap layer 130 can have a thickness ranging from about 20 nm to about 1000 although the composition and thickness of the cap layer 130 are not limited. The cap layer 130 can be undoped or may be intentionally doped in order to control the carrier density within the 2DEG layer. In embodiments, the cap layer 130 can include multiple epitaxial layers to control the carrier density within the 2DEG layer as is well known in III-V device processing and is incorporated herein without limitations.

To form a desired LED structure 102, various epi-layers can then be formed over the selectively doped epi-region 124 (e.g., a highly doped n-region of a GaN layer). For example, a first doped layer 140, e.g., n-doped GaN or n-doped AlGaN, can be epitaxially formed over the doped epi-region 124. A MQW active region 150 can be formed over the first doped layer 140, and a second doped layer 160, e.g., p-doped AlGaN, and a third doped layer 170, e.g., p-doped GaN, can then be formed over the MOW active region 150. In embodiments, the MQW active region 150 can include alternating layers of AlGaN and GaN, InGaN and GaN, and/or AlInGaN and InGaN. In embodiments, layers such as the exemplary p-doped AlGaN layer 160 and the exemplary p-doped GaN layer 170 can be formed above the active region 150. The LED structure 102 can also have a p-contact 172 formed over the exemplary p-doped layer 170.

As can be seen in FIG. 1A, the exemplary HFET driver circuit 108 can include an n-contact 176 for the source region of the exemplary HFET formed over the substrate 110, and a gate 174 formed over the heterostructure of the HFET. The LED structure 102 can be integrated as an extension to the "drain" region of the exemplary HFET driver circuit 108.

In embodiments, various conventional LEDs and HFETs can be combined and/or modified to form integrated LED devices. For example, conventional GaN/AlGaN HFET devices can be made to operate at frequencies above 1 GHz by reducing the length of the gate (see 174 of FIG. 1A). Conventional LEDs can operate at frequencies below 1 GHz. For this reason, the exemplary HFET driver circuit can be formed with a gate dimension that is sufficiently s all such that the speed of the HFET/LED integrated device can be limited by the speed of the LED and not by the speed of the HFET. In embodiments, the gate 174 for the exemplary HFET driver circuit can have a length ranging from about 0.1 μm to about 10 μm, although not limited. The exemplary LED structure 102 can have a width ranging from about 100 μm to about 1,000 μm, although not limited.

When in operation, the p-contact 172 of the LED structure 102 can be electrically biased positive, while the n-contact 176 of the HFET driver circuit 108 can be electrically grounded or biased negative. The current through the HFET driver circuit can be controlled by the electrical bias on the gate 174 and all HFET current can flow through the LED structure 102. Note that although the integrated LED device 100A shown in FIG. 1A depicts, a final stage, i.e., a high-power stage, of the driver circuit, one of ordinary skill in the art would understand that additional stages of the driver circuit can be integrated into the driver circuit 108.

In this manner, series resistance and/or inductance between the exemplary HFET driver circuit 108 and the LED structure 102 can be minimized or eliminated. As a result, robust, mass producible, high-power integrated LED devices can be obtained and can be operable under a wide range of driver conditions with a low failure rate.

FIG. 1B depicts another exemplary integrated HFET LED device 100B in accordance with various embodiments of the present teachings. As shown, a "thinned substrate" LED can be bump-bonded with a drain 178 of an HFET driver circuit, for example, a GaN/AlGaN HFET. Compared with the device 100A using epitaxial techniques to integrate the LED structure, the device 100B shown in FIG. 1B can use bump-bonding techniques to integrate LED structure with the HFET driver circuit, which provides simplicity of manufacture. In embodiments, the device 100B of FIG. 1B can have an adequate performance for many solid-state lighting (SSL) applications.

Specifically, the device 100B can include an HFET driver circuit 208 having a substrate 110. Over the substrate 110, an epitaxial layer 120, for example, a GaN layer, can be formed over the entire surface of the substrate 110. The epitaxial layer 120 can be un-doped. An HFET driver circuit heterostructure can then be formed to include a portion of the epitaxial layer 120. The heterostructure can include a wide-bandgap cap layer 130 formed over the portion of the epitaxial layer 120 (e.g., an un-doped GaN layer) with a 2DEG layer 134 formed at the interface between the cap layer 130 and the undoped epitaxial layer 120.

The exemplary HFET driver circuit 208 can include an n-contact 176 for the source region, a p-contact 178 for the drain region, and a gate 174, formed using suitable materials and methods as known to one of ordinary skill in the art.

On the other hand, the LED structure 202 having a thinned conducting substrate 126 can be formed. The thinned conducting substrate 126 can have a thickness ranging from about 1 μm to about 100 μm. The thinned conducting substrate 126 can be formed of a material including, but not limited to, silicon carbide (SiC), silicon (Si), silicon-on-insulator (SOI), and GaN. The thinned conducting substrate 126 can be used as an n-contact for the exemplary LED structure 202.

As similarly described in FIG. 1A, the LED structure 202 can include various epi-layers including, for example, a MQW active region 150 disposed between an n-doped layer 140, e.g., n-doped GaN or n-doped AlGaN, and a p-doped layer 160, e.g., p-doped AlGaN, and an additional p-doped layer 170, e.g., p-doped GaN. In embodiments, doped layers 160 and 170 can be disposed above the MQW active region 150 and the doped layer 140, as also shown in FIG. 1A. A p-contact 172 can then be formed over the p-doped layer 170.

As can be seen in FIG. 1B, the exemplary LED structure 202 can be integrated by bonding the thinned conducting substrate 126, i.e., the n-contact of the LED structure 202, with the drain contact 178 of the exemplary HFET driver circuit 208 by a bump bond 190. In this manner, the LED structure 202 can be integrated as an extended drain to the drain region of the exemplary HFET driver circuit 208. Various suitable bump bonding techniques known to one of ordinary skill in the art can be used.

In embodiments, any other suitable driver circuits can be integrated with LED devices in accordance with various embodiments of the present teachings. For example, FIGS. 2A-2B depict an exemplary thyristor driver circuit integrated with an LED structure. The thyristor driver circuit can be, e.g., a GaN-based thyristor, a silicon-based thyristor, a diamond-based thyristor, a GaAs-based thyristor, a SiC-based thyristor, or combinations thereof. For example, the Si-based thyristor can provide thermal heat-sinking properties to the devices 200A-200B.

In FIG. 2A, the integrated LED device 200A can include an LED structure 302 integrated with an exemplary thyristor driver circuit 308. The LED structure 302 can be used as an extension to the anode of the thyristor driver circuit 308 using a bump-bond 290.

As shown in FIG. 2A, the exemplary thyristor driver circuit 308 can include a thyristor active region 210 having a thyristor cathode 222, a thyristor anode 228, and a thyristor gate 226. In embodiments, the thyristor cathode 222 can be configured on one side of the thyristor active region 210, while the thyristor anode 228 and the thyristor gate 226 can be configured on an opposite side of the thyristor active region 210. In embodiments, the thyristor driver circuit 308 can include any thyristors known to one of ordinary skill in the art.

In embodiments, the LED structure 302 can be configured over the thyristor driver circuit 308. In one embodiment, the LED structure 302 can be the LED structure 202 as depicted in FIG. 1B, or the LED structure 102 as depicted in FIG. 1A, or any other LED structures that can be bonded with the thyristor anode 228. In embodiments, the LED structure 302 can include a GaN-based LED. For example, the LED structure 302 can have a MQW active region 250 disposed between an n-doped layer 240, e.g., n-doped GaN or n-doped AlGaN, and a p-doped layer 260, e.g., p-doped AlGaN above which is another p-doped layer 270, e.g., p-doped GaN. The n-doped layer 240 which can be a conducting thinned substrate (see 126 in FIG. 1B) can be formed on an n-contact 262, in one embodiment. The MQW active region 250 can include barrier layers such as AlGaN layers. The LED structure 302 can include a p-contact 272 formed over the p-doped layer 270. The LED structure 302 can be bonded by bonding the n-contact 262 with the thyristor anode 228 through the bump-bond 290 using suitable bonding techniques, FIG. 2B depicts an exemplary all-epitaxial device for integrating thyristor driver circuits with LEDs without using the bump-bonding techniques. For example, a GaN-based LED can be epitaxially grown directly on a Si-based thyristor as similarly described in FIG. 1A.

Specifically, a thyristor driver circuit 408 including a thyristor active region 210, for example, a silicon-based thyristor, and a thyristor cathode 222 formed on one side of the thyristor active region 210. At least one n-doped epi-layer 224 and/or 240 can then be epitaxially formed on a surface portion of the thyristor active region 210 opposing the thyristor cathode 222. A multi-quantum-well (MQW) active region 250 can then be epitaxially formed over the at least one n-doped epi-layer 224/240 to form an exemplary LED structure 402 as an extended anode of the thyristor driver circuit 408. As similarly described in FIGS. 1A-1B and FIG. 2A, the LED structure 402 in FIG. 2B can also include exemplary p-doped layers 260/270 and p-contact 272.

In embodiments, the thyristor driver circuits can be selected to allow current passage only for forward current through the LED structures, when the AC power cycle is positive on the anode 272. Meanwhile, the selected thyristor driver circuits can prevent current passage during a negative part of the AC power cycle. During the forward bias, a small voltage of about 3 V to about 10 V can drop across the LED structures with most of the voltage dropped across the thyristor driver circuit. That is, in normal rectifying mode, the integrated LED devices can be configured to emit light for most of the positive AC power cycle. In embodiments, conventional approaches, for example, to avoid any appearance of the 60 Hz "flicker" in the LED output, can be used.

The configuration of the integrated device 200A-200B can allow a solid state lighting (SSL) LED to be driven from a 110V-AC power source. For example, the integrated device 200A can create an LED lamp that can be inserted into regular 110V, AC lamp sockets. When in operation, the p-contact 272 of the LED structure can become an extended anode of the thyristor driver circuit and can be connected to one side of the 110V AC power supply. The other side of the AC supply can connect to the thyristor cathode 222 via additional standard circuitry in order to limit or control the current. In embodiments, the thyristor driver circuits can be triggered using a conventional method including gate pulse, light pulse, etc.

In embodiments, the AC powered integrated devices can have advantages of LED-based lighting, for example, with higher efficiency, and/or multi-functionality. The devices and methods disclosed herein can accelerate implementation of LED-based lighting. In embodiments, the disclosed integration of the devices 200A-200B in FIGS. 2A-2B can use conventional technologies that are used in high-volume production settings including silicon thyristor technology, "thinned substrate" GaN-LED technology, and/or bump-bonding technology. For example, the heat sinking technology of the Si-based thyristors can be exploited to extract heat from the LED structures of the devices 200A-200B. In embodiments, the resistance and inductance of the LED thyristor connection can be minimized or eliminated to avoid the problems in the prior art and facilitating high current LED operation.

In embodiments, the integrated LED devices 200A-200B can be operated at a high current of at least about 0.1 Amp, such as in the range from about 0.1 Amp to about 100 Amp.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. An integrated light emitting diode (LED) device comprising:
    a thyristor driver circuit comprising a thyristor active region on a thyristor cathode and a thyristor anode disposed over a portion of the thyristor active region, and
    an LED structure disposed over the thyristor anode of the thyristor driver circuit, wherein the LED structure is disposed over an opposing surface of the thyristor cathode and comprises a multi-quantum-well (MQW) active region.

2. The device of claim 1, wherein the LED structure has a width ranging from about 100 μm to 1,000 μm.

3. The device of claim 1, wherein the thyristor driver circuit comprises a silicon-based thyristor, a GaN-based thyristor, a diamond-based thyristor, a GaAs-based thyristor, a SiC-based thyristor, or combinations thereof.

4. The device of claim 1, wherein the LED structure further comprises an n-contact for the MQW active region, wherein the anode of the thyristor driver circuit is bonded with the n-contact of the LED structure.

5. The device of claim 1, wherein the LED structure further comprises at least one n-doped layer epitaxially disposed over the portion of the thyristor active region, wherein the MQW active region is epitaxially disposed over the at least one n-doped layer of the LED structure.

6. The device of claim 1, wherein the integrated LED device has an operating current ranging from about 0.1 Amp to about 100 Amp.

* * * * *